(12) United States Patent
Bradley

(10) Patent No.: US 7,382,078 B2
(45) Date of Patent: Jun. 3, 2008

(54) ELECTROSTATIC DISCHARGE PROTECTION OF THIN-FILM RESONATORS

(75) Inventor: Paul D. Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 21 days.

(21) Appl. No.: 11/454,722

(22) Filed: Jun. 16, 2006

(65) Prior Publication Data

US 2006/0270090 A1    Nov. 30, 2006

Related U.S. Application Data

(63) Continuation-in-part of application No. 10/752,661, filed on Jan. 6, 2004, now Pat. No. 7,094,678.

(51) Int. Cl.
*H01L 41/22* (2006.01)

(52) U.S. Cl. ............... 310/320; 310/324; 257/414; 257/416

(58) Field of Classification Search ............... 310/320, 310/324; 257/416
See application file for complete search history.

(56) References Cited

U.S. PATENT DOCUMENTS

| | | | | |
|---|---|---|---|---|
| 5,873,153 | A * | 2/1999 | Ruby et al. | 29/25.35 |
| 7,053,456 | B2* | 5/2006 | Matsuo | 257/415 |
| 2004/0125970 | A1* | 7/2004 | Kawakubo | 381/190 |
| 2005/0140247 | A1* | 6/2005 | Lee | 310/320 |
| 2006/0202779 | A1* | 9/2006 | Fazzio et al. | 333/187 |

* cited by examiner

*Primary Examiner*—Kenneth Parker
*Assistant Examiner*—José R. Diaz

(57) ABSTRACT

A method for fabricating an apparatus is disclosed. A substrate is provided and a seed layer is fabricated on the substrate. A thin-film resonator is fabricated on the substrate, the resonator including a portion of a bottom electrode layer and a portion of a top electrode layer. Then, at least one aligned opening is etched through the bottom electrode layer and the seed layer. Finally, at least one bonding pad is fabricated, the bonding pad extending through the aligned opening such that bonding pad contacts the substrate forming a Schottky diode.

4 Claims, 6 Drawing Sheets

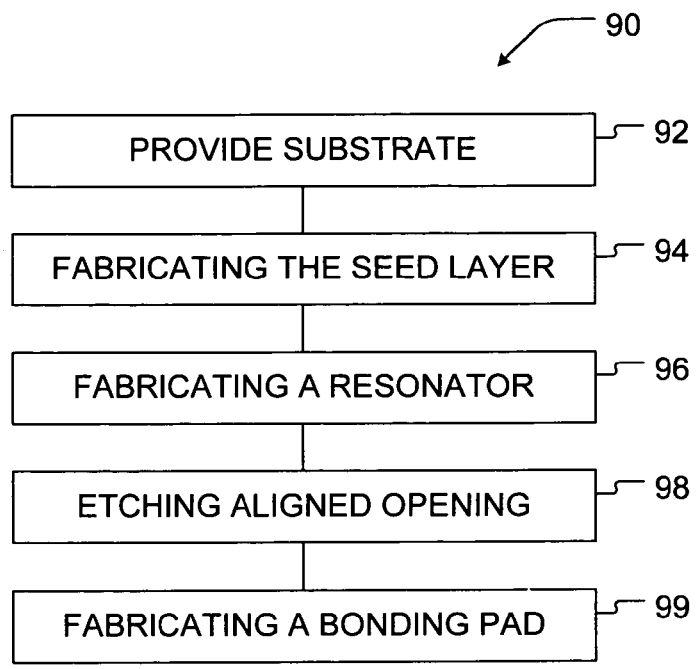
FIG. 6
FIG. 7
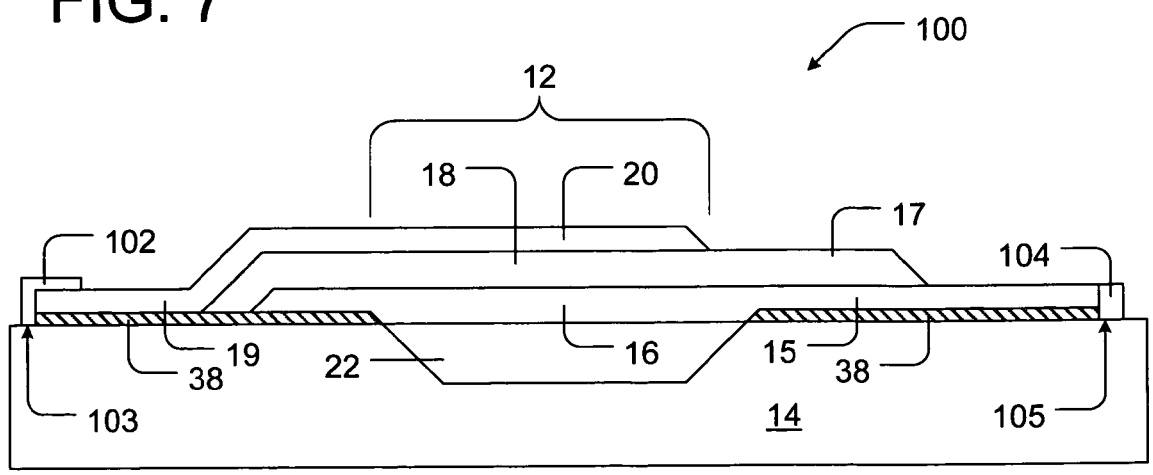

ELECTROSTATIC DISCHARGE PROTECTION OF THIN-FILM RESONATORS

CROSS REFERENCE TO RELATED APPLICATION

This continuation-in-part application claims the benefit under 35 U.S.C. Section 120 of U.S. patent application Ser. No. 10/752,661, entitled "Electrostatic Discharge Protection of Thin-Film Resonators" by Paul D. Bradley filed Jan. 6, 2004, now U.S. Pat. No. 7,094,678 which, in turn, claims the benefit under 35 U.S.C. Section 120 of U.S. patent application Ser. No. 10/209,602 which was filed Jul. 30, 2002 and was granted as U.S. Pat. No. 6,894,360 on Jul. 30, 2002.

BACKGROUND

The present invention relates to acoustic resonators, and more particularly, to resonators that may be used as filters for electronic circuits.

The need to reduce the cost and size of electronic equipment has led to a continuing need for ever-smaller electronic filter elements. Consumer electronics such as cellular telephones and miniature radios place severe limitations on both the size and cost of the components contained therein. Further, many such devices utilize electronic filters that must be tuned to precise frequencies. Filters select those frequency components of electrical signals that lie within a desired frequency range to pass while eliminating or attenuating those frequency components that lie outside the desired frequency range.

One class of electronic filters that has the potential for meeting these needs is constructed from thin film bulk acoustic resonators (FBARs). These devices use bulk longitudinal acoustic waves in thin film piezoelectric (PZ) material. In one simple configuration, a layer of PZ material is sandwiched between two metal electrodes. The sandwich structure is preferably suspended in air. A sample configuration of an apparatus 10 having a resonator 12 (for example, an FBAR) is illustrated in FIGS. 1A and 1B. FIG. 1A illustrates a top view of the apparatus 10 while FIG. 1B illustrates a side view of the apparatus 10 along line A-A of FIG. 1A. The resonator 12 is fabricated above a substrate 14. Deposited and etched on the substrate 14 are, in order, a bottom electrode layer 15, piezoelectric layer 17, and a top electrode layer 19. Portions (as indicated by brackets 12) of these layers—15, 17, and 19—that overlap and are fabricated over a cavity 22 constitute the resonator 12. These portions are referred to as a bottom electrode 16, piezolectric portion 18, and a top electrode 20. In the resonator 12, the bottom electrode 16 and the top electrode 20 sandwiches the PZ portion 18. The electrodes 16 and 20 are conductors while the PZ portion 18 is typically crystal such as Aluminum Nitride (AlN).

When electric field is applied between the metal electrodes 16 and 20, the PZ portion 18 converts some of the electrical energy into mechanical energy in the form of mechanical waves. The mechanical waves propagate in the same direction as the electric field and reflect off of the electrode/air interface.

At a resonant frequency, the resonator 12 acts as an electronic resonator. The resonant frequency is the frequency for which the half wavelength of the mechanical waves propagating in the device is determined by many factors including the total thickness of the resonator 12 for a given phase velocity of the mechanical wave in the material. Since the velocity of the mechanical wave is four orders of magnitude smaller than the velocity of light, the resulting resonator can be quite compact. Resonators for applications in the GHz range may be constructed with physical dimensions on the order of less than 100 microns in lateral extent and a few microns in total thickness. In implementation, for example, the resonator 12 is fabricated using known semiconductor fabrication processes and is combined with electronic components and other resonators to form electronic filters for electrical signals.

The use and the fabrication technologies for various designs of FBARs for electronic filters are known in the art and a number of patents have been granted. For example, U.S. Pat. No. 6,262,637 granted to Paul D. Bradley et al. discloses a duplexer incorporating thin-film bulk acoustic resonators (FBARs). Various methods for fabricating FBARs also have been patented, for example, U.S. Pat. No. 6,060,181 granted to Richard C. Ruby et al. discloses various structures and methods of fabricating resonators, and U.S. Pat. No. 6,239,536 granted to Kenneth M. Lakin discloses method for fabricating enclosed thin-film resonators.

However, the continuing drive to increase the quality and reliability of the FBARs presents challenges requiring even better resonator quality, designs, and methods of fabrication. For example, one such challenge is to eliminate or alleviate susceptibility of the FBARs from damages from electrostatic discharges and voltage spikes from surrounding circuits. Another challenge is to eliminate or alleviate susceptibility of the resonator from frequency drifts due to interaction with its environment such as air or moisture.

SUMMARY

These and other technological challenges are met by the present invention. According to a first aspect of the present invention, an electronic filter includes a thin-film resonator fabricated on a semiconductor substrate and bonding pad connected to the thin-film resonator, the bonding pad forming a Schottky diode with the substrate to protect the thin-film resonator from electrostatic discharges.

According to a second aspect of the present invention, a method for fabricating an electronic filter is disclosed. A thin-film resonator is fabricated on a substrate. With the resonator, a bonding pad is fabricated, the bonding pad being connected to the thin-film resonator and a portion of the bonding-pad being in contact with the substrate to form a Schottky diode.

According to a third aspect of the present invention, a method for fabricating an apparatus is disclosed. A substrate is provided and a seed layer is fabricated on the substrate. A thin-film resonator is fabricated on the substrate, the resonator including a portion of a bottom electrode layer and a portion of a top electrode layer. Then, at least one aligned opening is etched through the bottom electrode layer and the seed layer. Finally, at least one bonding pad is fabricated, the bonding pad extending through the aligned opening such that bonding pad contacts the substrate forming a Schottky diode.

According to a fourth aspect of the present invention, a method for fabricating an apparatus is disclosed. A substrate is provided and a cavity is etched into the substrate. The cavity is filled with sacrificial material. A thin-film resonator is fabricated on the substrate, the resonator including a portion of a bottom electrode layer and a portion of a top electrode layer. The bottom electrode and the top electrode are etched providing at least one opening. The seed layer is etched providing at least one opening, the opening aligned with the opening of the thin-film resonator. Next, at least one bonding pad is fabricated, the bonding pad extending through the aligned opening such that bonding pad contacts the substrate forming a Schottky diode. Then, the sacrificial material removed.

According to a fifth aspect of the present invention, a method for fabricating an apparatus is disclosed. A substrate is provided and a seed layer is fabricated on the substrate. A thin-film resonator is fabricated on the substrate, the resonator including a portion of a bottom electrode layer and a portion of a top electrode layer. At least one bonding pad is fabricated, the bonding pad extending from the bottom electrode to the substrate such that the bonding pad contacts the substrate forming a Schottky diode.

According to a sixth aspect of the present invention, an apparatus includes a substrate, a seed layer on the substrate, a thin-film resonator fabricated on the substrate, and at least one bonding pad. The thin-film resonator fabricated on said substrate, said resonator including a portion of a bottom electrode layer and a portion of a top electrode layer. At least one bonding pad on the bottom layer, the bonding pad extending from the bottom layer to the substrate, such that the bonding pad contacts the substrate forming a Schottky diode.

According to a seventh aspect of the present invention, an apparatus includes a substrate, a seed layer on the substrate, a thin-film resonator fabricated on the substrate, and at least one bonding pad. The seed layer has at least one opening. The resonator includes a portion of a bottom electrode layer and a portion of a top electrode layer, the bottom electrode layer having at least one opening aligned with the opening of said seed layer. The bonding pad extends through the aligned opening such that bonding pad contacts the substrate forming a Schottky diode.

Other aspects and advantages of the present invention will become apparent from the following detailed description, taken in combination with the accompanying drawings, illustrating by way of example the principles of the invention.

BRIEF DESCRIPTION OF THE DRAWINGS

FIG. 6 is a flowchart illustrating the steps for manufacturing the apparatus illustrated in FIG. 5.

FIG. 7 is a cutaway side view of an apparatus in accordance with yet another embodiment.

DETAILED DESCRIPTION

Figure 1A:
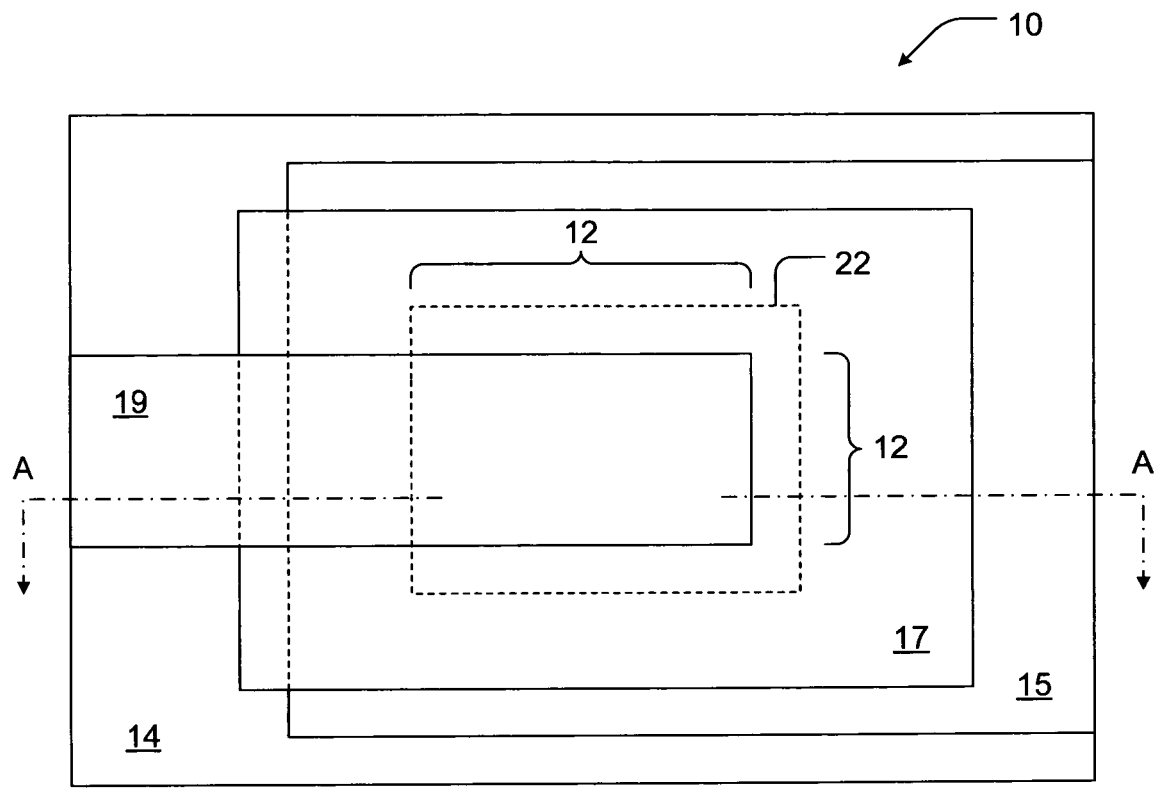
FIG. 1A is a top view of an apparatus including a resonator known in prior art.

As shown in the drawings for purposes of illustration, the present invention is embodied in a filter having a thin-film resonator fabricated on a semiconductor substrate. Bonding pad connecting the resonator to the rest of the filter circuit is connected to the resonator. The bonding pad is in contact with the substrate thereby forming a Schottky junction diode. In normal operations, the diode is an open circuit and does not affect the operations of the filter. When an electrostatic discharge (ESD) spike voltage is introduced to the resonator via the bonding pad, the diode closes thereby discharging the ESD voltage to the substrate thereby protecting the resonator.

Figure 1B:
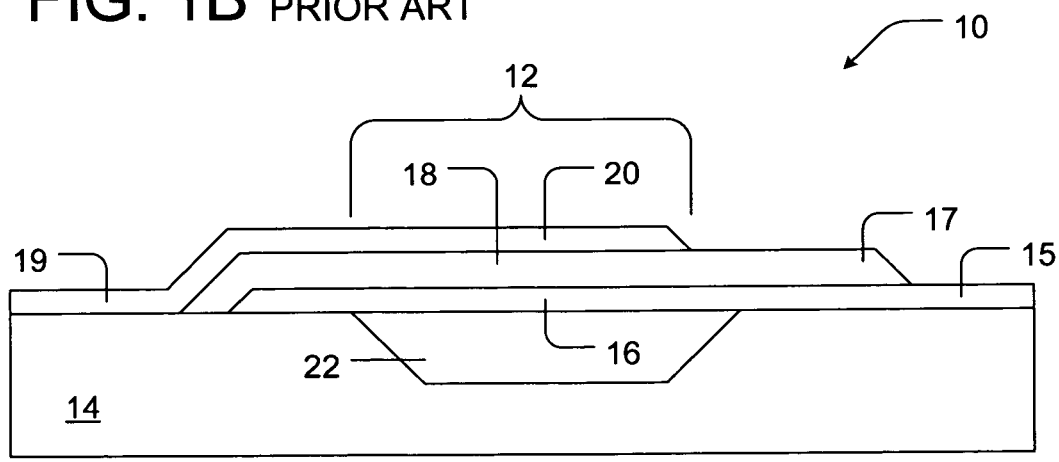
FIG. 1B is a side view of the apparatus of FIG. 1A cut along line A-A.
Figure 2A:
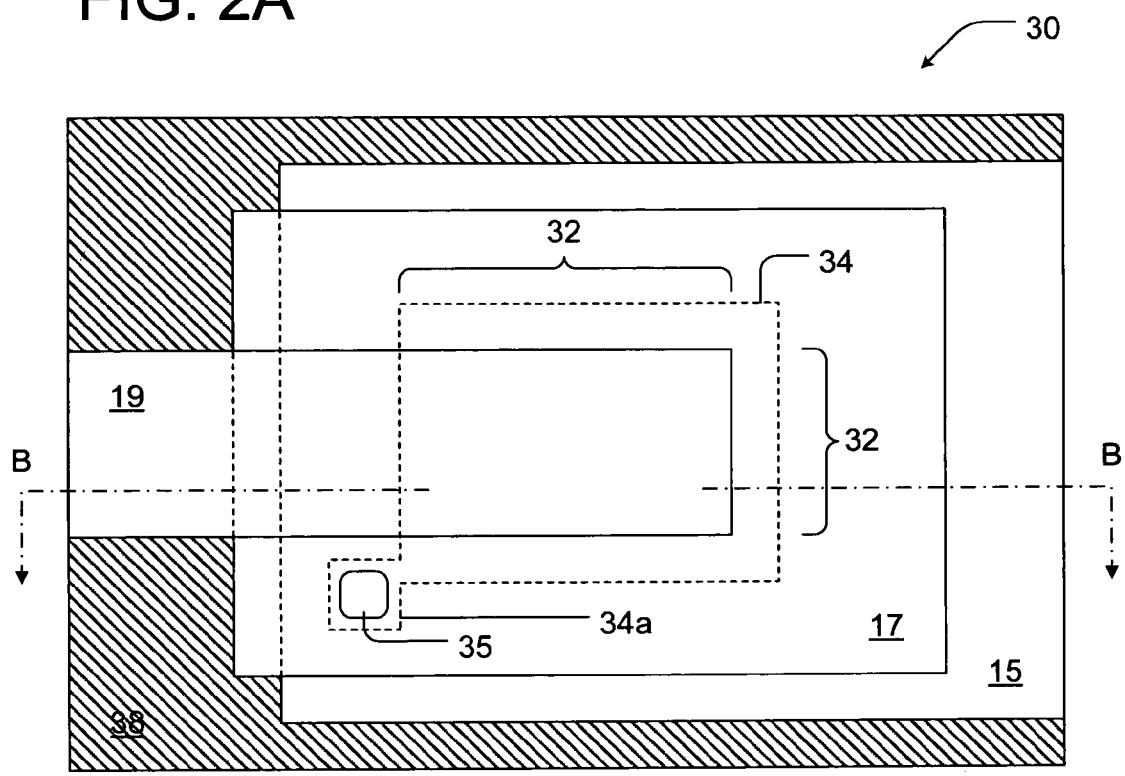
FIG. 2A is a top view of an apparatus according to a first embodiment of the present invention.
Figure 2B:
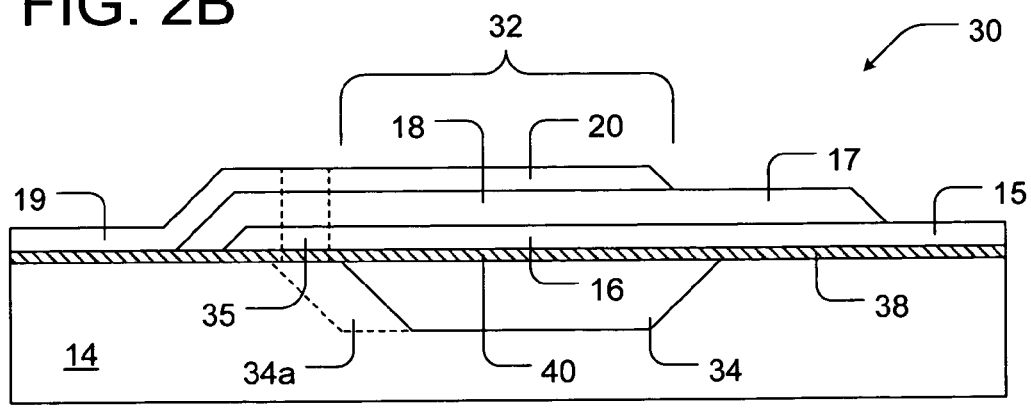
FIG. 2B is a side view of the apparatus of FIG. 2A cut along line B-B.

FIG. 2A illustrates a top view of an apparatus 30 according to a first embodiment of the present invention. FIG. 2B is a side view of the apparatus 30 of FIG. 2A cut along line B-B. Portions of the apparatus 30 in FIGS. 2A and 2B are similar to those of the apparatus 10 of FIGS. 1A and 1B. For convenience, portions of the apparatus 30 in FIGS. 2A and 2B that are similar to portions of the apparatus 10 of FIGS. 1A and 1B are assigned the same reference numerals and different portions are assigned different reference numerals. Referring to FIGS. 2A and 2B, the apparatus 30 according to one embodiment of the present invention includes a resonator 32 fabricated on a substrate 14. The apparatus 30 is fabricated first be etching a cavity 34 into the substrate 14 and filling it with suitable sacrificial material such as, for example, phosphosilicate glass (PSG). Then, the substrate 14, now including the filled cavity 34 is planarized using known methods such as chemical mechanical polishing. The cavity 34 can include an evacuation tunnel portion 34a aligned with an evacuation via 35 through which the sacrificial material is later evacuated.

Next, a thin seed layer 38 is fabricated on the planarized substrate 14. Typically the seed layer 38 is sputtered on the planarized substrate 14. The seed layer 38 can be fabricated using Aluminum Nitride (AlN) or other similar crystalline material, for example, Aluminum Oxynitride (ALON), Silicon Dioxide ($SiO_2$), Silicon Nitride ($Si_3N_4$), or Silicon Carbide (SiC). In the illustrated embodiment, the seed layer 38 is in the range of about 10 Angstroms (or one nanometer) to 10,000 Angstroms (or one micron) thick. Techniques and the processes of fabricating a seed layer are known in the art. For example, the widely known and used sputtering technique can be used for this purpose.

Then, above the seed layer 38, the following layers are deposited, in order: a bottom electrode layer 15, a piezoelectric layer 17, and a top electrode layer 19. Portions (as indicated by brackets 32) of these layers—36, 15, 17, and 19—that overlap and are situated above the cavity 34 constitute the resonator 32. These portions are referred to as a seed layer portion 40, bottom electrode 16, piezoelectric portion 18, and top electrode 20. The bottom electrode 16 and the top electrode 20 sandwiches the PZ portion 18.

The electrodes 16 and 20 are conductors such as Molybdenum and, in a sample embodiment, are in a range of 0.3 micron to 0.5 micron thick. The PZ portion 18 is typically made from crystal such as Aluminum Nitride (AlN), and, in the sample embodiment, is in a range from 0.5 micron to 1.0 micron thick. From the top view of the resonator 32 in FIG. 2A, the resonator can be about 150 microns wide by 100 microns long. Of course, these measurements can vary widely depending on a number of factors such as, without limitation, the desired resonant frequency, materials used, the fabrication process used, etc. The illustrated resonator 32 having these measurements can be useful in filters in the neighborhood of 1.92 GHz. Of course, the present invention is not limited to these sizes or frequency ranges.

The fabrication of the seed layer 38 provides for a better underlayer on which the PZ layer 17 can be fabricated. Accordingly, with the seed layer 38, a higher quality PZ layer 17 can be fabricated, thus leading to a higher quality resonator 32. In fact, in the present sample embodiment, the material used for the seed layer 38 and the PZ layer 17 are the same material, AlN. This is because seed layer 38 nucleates a smoother, more uniform bottom electrode layer 15 which, in turn, promotes a more nearly single crystal quality material for the PZ layer 17. Thus, piezoelectric coupling constant of the PZ layer 17 is improved. The improved piezoelectric coupling constant allows for wider bandwidth electrical filters to be built with the resonator 32 and also yields more reproducible results since it tightly approaches the theoretical maximum value for AlN material.

Figure 3A:
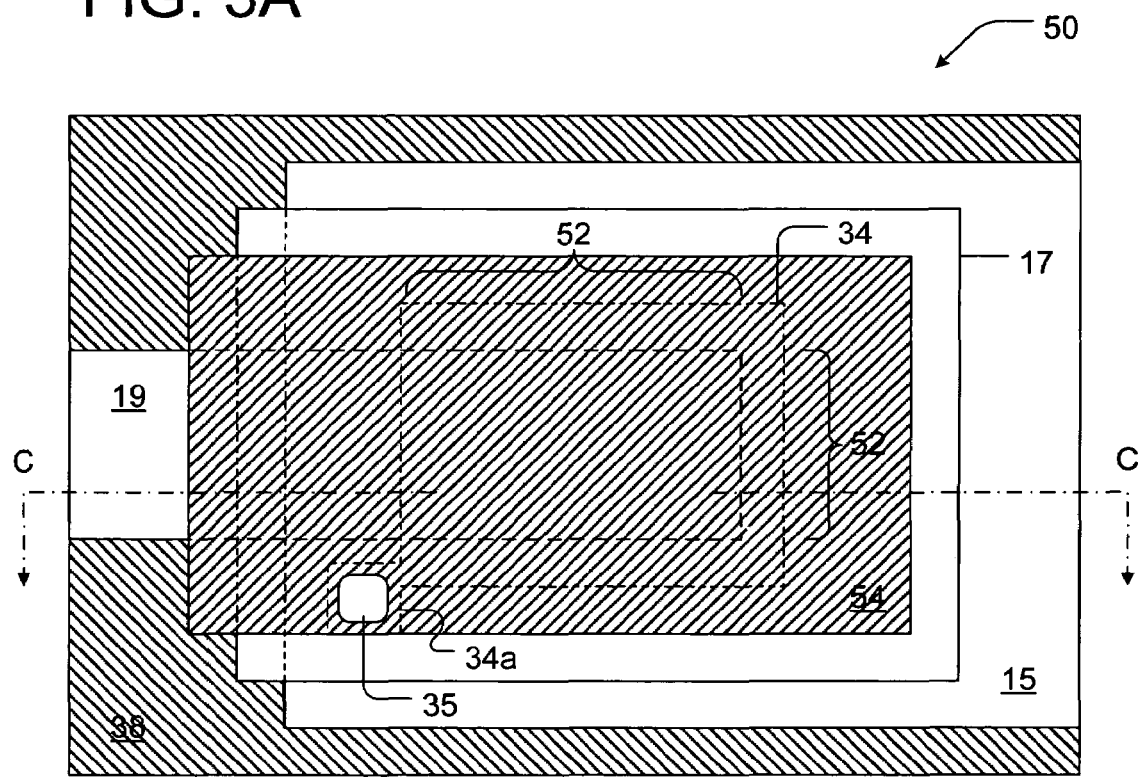
FIG. 3A is a top view of an apparatus according to a second embodiment of the present invention.
Figure 3B:
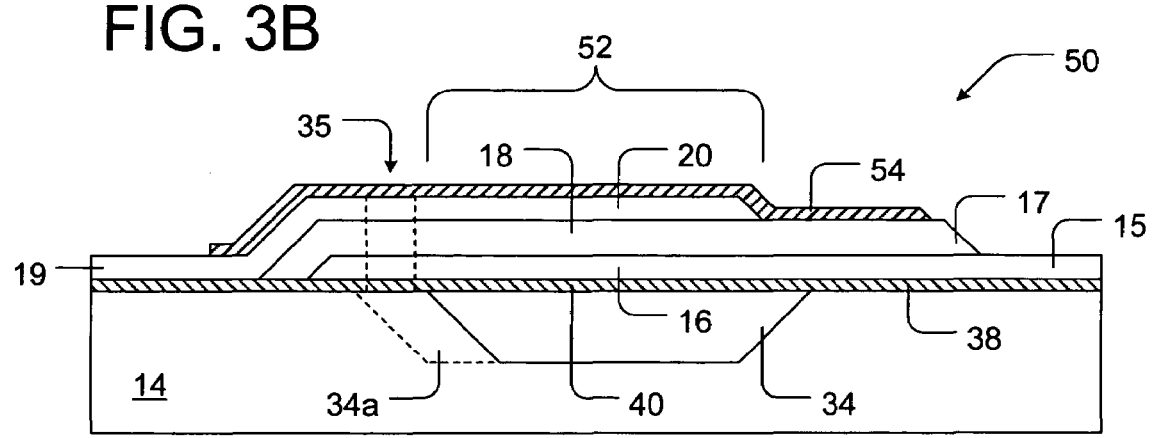
FIG. 3B is a side view of the apparatus of FIG. 3A cut along line C-C.

FIG. 3A illustrates a top view of an apparatus 50 according to a second embodiment of the present invention. FIG. 3B is a side view of the apparatus 50 of FIG. 3A cut along line C-C. Portions of the apparatus 50 in FIGS. 3A and 3B are similar to those of the apparatus 30 of FIGS. 2A and 2B. For convenience, portions of the apparatus 50 in FIGS. 3A and 3B that are similar to portions of the apparatus 30 of FIGS. 2A and 2B are assigned the same reference numerals and different portions are assigned different reference numerals.

Referring to FIGS. 3A and 3B, the apparatus 50 of the present invention includes a resonator 52 fabricated on a substrate 14. The apparatus 50 is fabricated similarly to the apparatus 30 of FIGS. 2A and 2B and discussed herein above. That is, bottom electrode layer 15, piezoelectric layer 17, and top electrode layer 19 are fabricated above a substrate 14 having a cavity 34. Optionally, a seed layer 38 is fabricated between the substrate 14 including the cavity 34 and the bottom electrode layer 15. Details of these layers are discussed above. The resonator 52 comprises portions (as indicated by brackets 52) of these layers—36, 15, 17, and 19—that overlap and are situated above the cavity 34. These portions are referred to as a seed layer portion 40, bottom electrode 16, piezoelectric portion 18, and top electrode 20. Finally, a protective layer 54 is fabricated immediately above the top electrode 20. The protective layer 54 covers, at least, the top electrode 20, and can cover, as illustrated, a larger area than the top electrode 20. Moreover, portion of the protective layer 54 that is situated above the cavity 34 is also a part of the resonator 52. That is, that portion of the protective layer 54 contributes mass to the resonator 52 and resonates with all the other parts—40, 16, 18, and 20—of the resonator 52.

The protective layer 54 chemically stabilizes and reduces the tendency of material to adsorb on the surface of the top electrode 20. Adsorbed material can change the resonant frequency of the resonator 32. The thickness may also be adjusted to optimize the electrical quality factor (q) of the resonator 32.

Without the protective layer 54, resonant frequency of the resonator 52 is relatively more susceptible to drifting over time. This is because the top electrode 20, a conductive metal, can oxidize from exposure to air and potentially moisture. The oxidization of the top electrode 20 changes the mass of the top electrode 20 thereby changing the resonant frequency. To reduce or minimize the resonant frequency-drifting problem, the protective layer 54 is typically fabricated using inert material less prone to reaction with the environment such as Aluminum Oxynitride (ALON), Silicon Dioxide ($SiO_2$), Silicon Nitride ($Si_3N_4$), or Silicon Carbide (SiC). In experiments, the protective layer 54 having thickness ranging from 30 Angstroms to 2 microns have been fabricated. The protective layer 54 can include AlN material, which can also be used for the piezoelectric layer 17.

Here, the seed layer portion 40 not only improves the crystalline quality of the resonator 52, but also serves as a protective underlayer protecting the bottom electrode 16 from reaction with air and possible moisture from the environment reaching the bottom electrode 16 via the evacuation via 35.

Figure 4A:
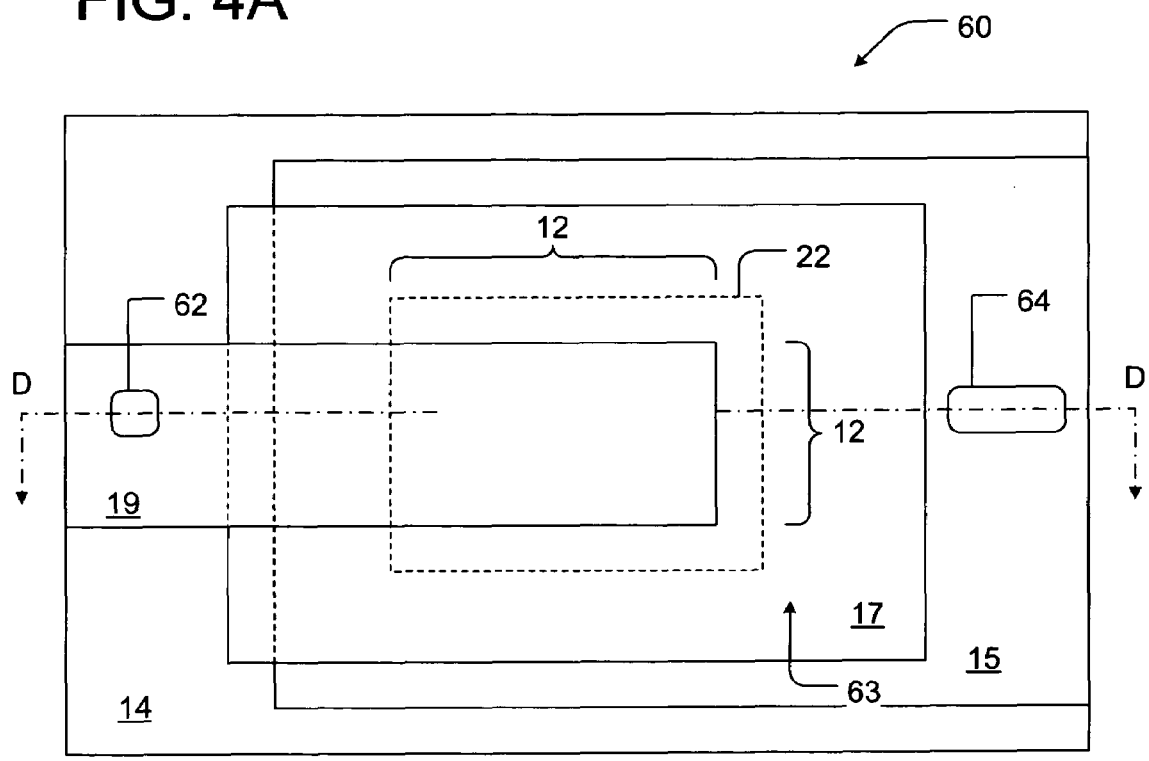
FIG. 4A is a top view of an apparatus according to a third embodiment of the present invention.
Figure 4B:
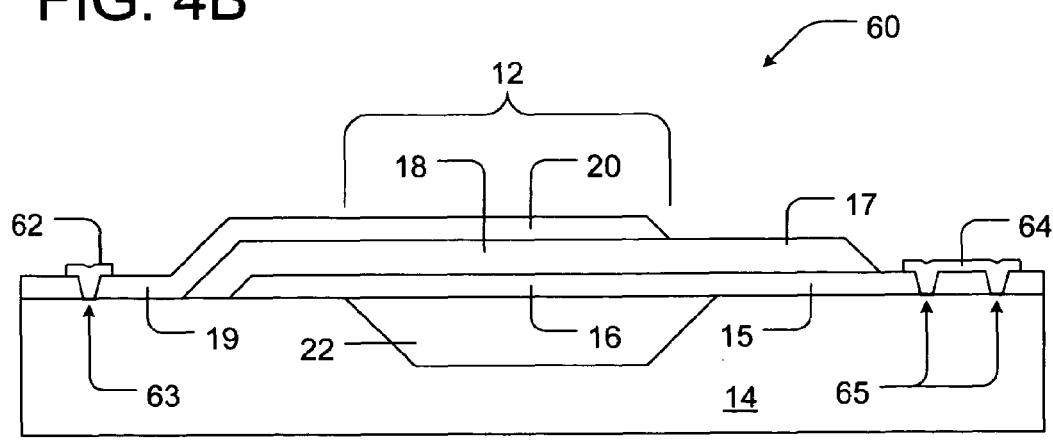
FIG. 4B is a side view of the apparatus of FIG. 4A cut along line D-D.
Figure 4C:
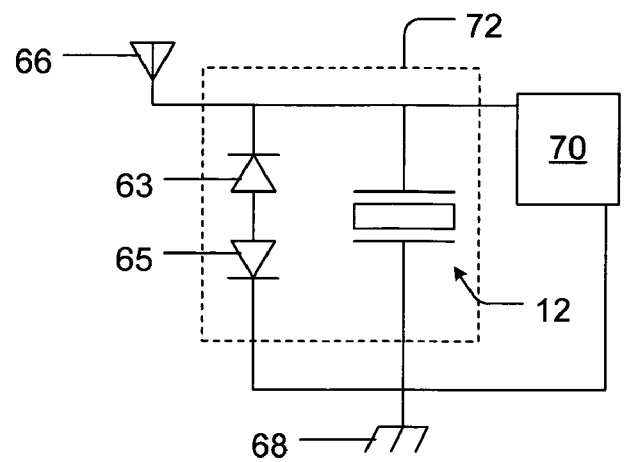
FIG. 4C is a schematic diagram illustrating, in part, a circuit that can be formed using the apparatus of FIG. 4A.

FIG. 4A illustrates a top view of an apparatus 60 according to a third embodiment of the present invention. FIG. 4B is a side view of the apparatus 60 of FIG. 4A cut along line D-D. FIG. 4C is a simple schematic illustrating, in part, an equivalent circuit that can be formed using the apparatus 60. Portions of the apparatus 60 in FIGS. 4A, 4B, and 4C are similar to those of the apparatus 10 of FIGS. 1A and 1B and the apparatus 30 of FIGS. 2A and 2B. For convenience, portions of the apparatus 60 in FIGS. 4A, 4B, and 4C that are similar to portions of the apparatus 10 of FIGS. 1A and 1B and portions of the apparatus 30 of FIGS. 2A and 2B are assigned the same reference numerals and different portions are assigned different reference numerals.

Referring to FIGS. 4A, 4B, and 4C, the apparatus 60 is fabricated similarly to the apparatus 10 of FIGS. 1A and 1B and discussed herein above. That is, bottom electrode layer 15, piezoelectric layer 17, and top electrode layer 19 are fabricated above a substrate 14 having a cavity 22. These layers are fabricated in a similar manner as the apparatus 30 of FIGS. 2A and 2B and the details of these layers are discussed above. The resonator 12, preferably a thin-film resonator such as an FBAR, comprises portions (as indicated by brackets 12) of these layers—15, 17, and 19—that overlap and are situated above the cavity 22. These portions are referred to as bottom electrode 16, piezoelectric portion 18, and top electrode 20.

The apparatus 60 includes at least one bonding pad. Illustrated in FIGS. 4A and 4B are a first bonding pad 62 and a second bonding pad 64. The first bonding pad 62 is connected to the resonator 12 by its top electrode layer 19. The first bonding pad 62 is in contact with the semiconductor substrate 14 thereby forming a Schottky junction diode 63. Operational characteristics of such diodes are known in the art.

Also illustrated is a second bonding pad 64 connected to the resonator 12 by its bottom electrode layer 15. The second bonding pad 64 is illustrated as making contact with the substrate 14 at two places thereby forming two Schottky diode contacts 65. In fact, a bonding pad can be fabricated to form, in combination with the substrate 14, a plurality of diode contacts for the protection of the resonator to which it is connected. The contacts 65 from a single pad 64 form, electrically, a single Schottky diode.

The bonding pads 62, 64 are typically fabricated using conductive metal such as gold, nickel, chrome, other suitable materials, or any combination of these.

FIG. 4C can be used to describe the operations of the filter circuit 72 having the resonator 12. Normally, no current flows through the diodes 63 and 65 as the diode 63 operate as an open circuit in one direction while diode 65 operates as a closed circuit in the opposite direction. However, when an electrostatic voltage spike is introduced to the resonator 12 via its bonding pad 64 (from, perhaps, an antennae 66), the diode 63 breaks down. When the diode 63 breaks down, it is effectively a closed short circuit, and allows the voltage spike to be transferred to the substrate 14, and eventually ground 68, thereby protecting the resonator 12 from the voltage spike. The other diode 65 operates similarly to protect the resonator 12 from voltage spikes from other electronic circuits 70 connected to the filter 72. That is, two metal pads, for example pads 62 and 64 connected to electrically opposing sides of the resonator 12, fabricated on semiconductor substrate create an electrical circuit of two back-to-back Schottky diodes which allow high voltage electrostatic discharges to dissipate harmlessly in the substrate rather than irreversibly breaking down the piezoelectric layer, for example PZ layer 17, which separates top and bottom electrodes, for example electrodes 16 and 20, from each other. An electronic schematic diagram of FIG. 4C illustrates such connection.

In an alternative embodiment, a single apparatus can include a resonator having all of the features discussed above including the seed layer 38 and the protective layer 54 illustrated in FIGS. 2A, 2B, 3A and 3B and bonding pads 62 and 64 (forming Shottky diodes 63 and 65) illustrated in FIGS. 4A and 4B. In the alternative embodiment, the pads 62 and 64 can be formed on the seed layer 38 with several microns of overhang over and beyond the top electrode layer 19 and the bottom electrode layer 15.

Figure 5:
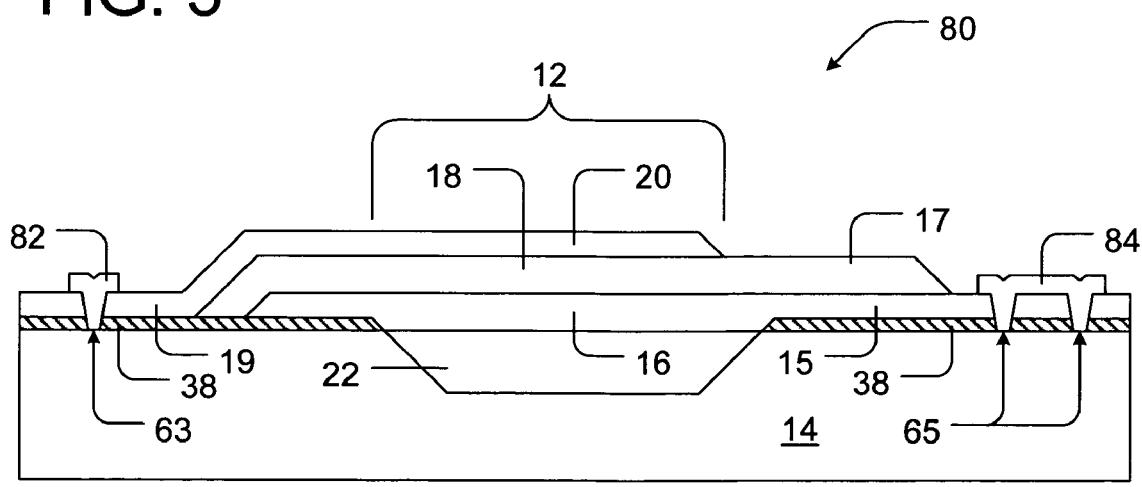
FIG. 5 is a cutaway side view of an apparatus in accordance with another embodiment of the present invention.

FIG. 5 is a cutaway side view of an apparatus 80 in accordance with another embodiment of the present invention. Portions of the apparatus 80 are similar to corresponding portions of the apparatus 50 of FIGS. 2A and 2B and also similar to corresponding portions of the apparatus 60 of FIGS. 3A and 3B. Portions of the apparatus 80 of FIG. 5 that are similar to the corresponding portions of the apparatus 50, corresponding portions of the apparatus 60, or both are assigned the same reference numerals. FIG. 6 is a flowchart 90 illustrating the steps for manufacturing the apparatus illustrated in FIG. 5 of FIG. 5.

Referring to FIGS. 5 and 6, another aspect of the present invention including a method of manufacturing the apparatus 80 is disclosed. First, the substrate 14 is provided. The substrate 14 is, for example, Silicon substrate 14. Step 92 of the flowchart 90. Then the seed layer 38 is fabricated on the substrate 14. The seed layer 38 has a number of functions including function as a diffusion barrier between the Silicon substrate 14 and one of the electrode layers 15 and 19. Step 94. Next, the resonator 12 is fabricated on the substrate 14 and the seed layer 38. Step 96. The resonator 12 is fabricated by deposited and etching, in order, the bottom electrode layer 15, the piezoelectric layer 17, and the top electrode layer 19. Portions (as indicated by brackets 12) of these layers—15, 17, and 19—that overlap and are over the cavity 22 constitute the resonator 12.

At least one opening is etched though the bottom electrode layer 15, the top electrode layer 19, or both layers. For each opening through the electrode layers 15 and 19, a corresponding opening is etched through the seed layer 38. The corresponding opening is aligned to the opening etched through the electrode layers 15 and 19. Step 98. Finally, one or more bonding pads 82, 84 are fabricated. The bonding pads 82, 84 extend through the aligned opening such that the pad contacts the substrate 14. The contact forms one or more Schottky diodes 63, 65 between the substrate 14 and the bonding pads 82, 84. In fact, as illustrated in the drawings, a plurality of Schottky diodes with the substrate 14. The Silicon substrate 14 has a high resistivity of, for example, in the order of 1,500 ohm-centimeters. But, here, the doping level may vary greatly. The Shottky diode is formed by the metal bonding pad and the silicon substrate because, in part, the silicon substrate 14 is doped with impurities. For example, in the illustrated example, the substrate 14 is doped with phosphorus to doping level of $10^{17}$ to $10^{19}$ atoms per cubic centimeter. Here, in the illustrated example, the dopant phosphorus is from the sacrificial material phosphosilicate glass (PSG) used to fill the cavity 22.

As already discussed, the cavity 22 is realized by etching the cavity 22 on the substrate 14 and filling the cavity 22 with sacrificial material. The sacrificial material can be, for example only, glass material which is later dissolved or otherwise removed to create the cavity 22. The sacrificial material is such as, for example only, SiO2, Aluminum (Al), Germanium (Ge), amorphous Silicon (amorphous-Si), porous Silicon (porous-Si), or phosphorus silicate glass (PSG). Following the fabrication of the resonator 12, the sacrificial material is removed from the cavity 22 thereby clearing the cavity 22 by exposure to acid such as, for example, Hydrofluoric Acid.

FIG. 7 is a cutaway side view of an apparatus 100 in accordance with yet another embodiment of the present invention. Portions of the apparatus 100 are similar to corresponding portions of the apparatus 80 of FIG. 5. Portions of the apparatus 100 of FIG. 7 that are similar to the corresponding portions of the apparatus 80 of FIG. 5 are assigned the same reference numerals. Referring to FIG. 7, in the apparatus 100, its bonding pads 102 and 104 do not require openings in the electrode layers 15 and 19. Rather, the bonding pads 102 and 104 extend from one of the electrodes to the substrate. For example, the bonding pad 104 is adjacent with and extends from the bottom electrode layer 15 to the substrate 14. The bonding pad 104 contacts the substrate 14 forming a Schottky diode 105. In another example, the bonding pad 102 is adjacent with and extends from the top electrode layer 19 to the substrate 14. The bonding pad 102 contacts the substrate 14 forming a Schottky diode 103. Here, the bonding pad 102 extends from above the top electrode layer 19 to the substrate 14.

From the foregoing, it will be appreciated that the present invention is novel and offers advantages over the current art. Although a specific embodiment of the invention is described and illustrated above, the invention is not to be limited to the specific forms or arrangements of parts so described and illustrated. For example, the bonding pads 102, 104 can be implemented in other configurations and still fall within the present invention. The invention is limited by the claims that follow.

What is claimed is:

1. An apparatus comprising:
   a substrate;
   a seed layer on said substrate;
   a thin-film resonator fabricated on said substrate, said resonator including a portion of a bottom electrode layer and a portion of a top electrode layer; and
   bonding pad on the bottom layer, the bonding pad extending from the bottom layer to the substrate, such that the bonding pad contacts the substrate forming a Schottky diode.

2. The apparatus recited in claim 1 wherein the bottom electrode layer having at least one opening aligned with the opening of said seed layer.

3. An apparatus comprising:
   a substrate;
   a seed layer on said substrate, said seed layer having at least one opening;
   a thin-film resonator fabricated on said substrate, said resonator including a portion of a bottom electrode layer and a portion of a top electrode layer, the bottom electrode layer having at least one opening aligned with the opening of said seed layer;
   bonding pad on the bottom layer, the bonding pad extending through the aligned opening such that bonding pad contacts the substrate forming a Schottky diode.

4. The apparatus recited in claim 3 wherein said bonding pad forms a plurality of Schottky diodes with the substrate.

* * * * *